(12) United States Patent
Hsu et al.

(10) Patent No.: US 12,416,853 B2
(45) Date of Patent: Sep. 16, 2025

(54) EUV PHOTO MASKS AND MANUFACTURING METHOD THEREOF

(71) Applicant: TAIWAN SEMICONDUCTOR MANUFACTURING COMPANY, LTD., Hsinchu (TW)

(72) Inventors: Pei-Cheng Hsu, Taipei (TW); Ta-Cheng Lien, Cyonglin Township (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/230,968

(22) Filed: Aug. 7, 2023

(65) Prior Publication Data

US 2023/0375910 A1 Nov. 23, 2023

Related U.S. Application Data

(63) Continuation of application No. 17/065,712, filed on Oct. 8, 2020, now Pat. No. 11,829,062.
(Continued)

(51) Int. Cl.
*G03F 1/24* (2012.01)
*G03F 1/54* (2012.01)
(Continued)

(52) U.S. Cl.
CPC .................. *G03F 1/24* (2013.01); *G03F 1/54* (2013.01); *H01L 21/0274* (2013.01); *H01L 21/0332* (2013.01)

(58) Field of Classification Search
CPC ... H01L 21/0332; H01L 21/0274; G03F 1/54; G03F 1/24
See application file for complete search history.

(56) References Cited

U.S. PATENT DOCUMENTS

| 8,796,666 B1 | 8/2014 | Huang et al. |
| 9,093,530 B2 | 7/2015 | Huang et al. |

(Continued)

FOREIGN PATENT DOCUMENTS

| JP | 2004-006799 A | 1/2004 |
| JP | 2009-212220 A | 9/2009 |

(Continued)

OTHER PUBLICATIONS

Notice of Allowance issued in U.S. Appl. No. 17/065,712, dated Jul. 25, 2023.

(Continued)

*Primary Examiner* — Raj R Gupta
(74) *Attorney, Agent, or Firm* — STUDEBAKER BRACKETT PLLC

(57) ABSTRACT

In a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer, and the absorber layer is made of Cr, CrO or CrON. The photo resist layer is patterned, the hard mask layer is patterned by using the patterned photo resist layer, the absorber layer is patterned by using the patterned hard mask layer, and an additional element is introduced into the patterned absorber layer to form a converted absorber layer.

20 Claims, 12 Drawing Sheets

Related U.S. Application Data

(60) Provisional application No. 63/028,637, filed on May 22, 2020.

(51) Int. Cl.
 *H01L 21/027* (2006.01)
 *H01L 21/033* (2006.01)

(56) References Cited

U.S. PATENT DOCUMENTS

| | | |
|---|---|---|
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 11,829,062 B2 * | 11/2023 | Hsu ................ H01L 21/0274 |
| 2002/0052127 A1 | 5/2002 | Gau et al. |
| 2005/0238922 A1 | 10/2005 | Kinoshita et al. |
| 2006/0099517 A1 * | 5/2006 | Sugawara ............ B82Y 40/00 430/311 |
| 2008/0248409 A1 * | 10/2008 | Ishibashi ................ G03F 1/24 430/5 |
| 2009/0220869 A1 * | 9/2009 | Takai ................ B82Y 10/00 430/5 |
| 2013/0196255 A1 | 8/2013 | Hayashi |
| 2017/0351169 A1 | 12/2017 | Yu et al. |
| 2018/0031965 A1 | 2/2018 | Jindal |
| 2018/0114690 A1 * | 4/2018 | Nishikawa .......... H01L 21/0332 |
| 2019/0369483 A1 * | 12/2019 | Ikebe ................ G03F 1/40 |
| 2019/0369484 A1 * | 12/2019 | Tu ................ G03F 1/22 |
| 2021/0405519 A1 * | 12/2021 | Lee ................ G03F 1/24 |
| 2022/0091498 A1 | 3/2022 | Kataoka |

FOREIGN PATENT DOCUMENTS

| | | |
|---|---|---|
| JP | 2011-187804 A | 9/2011 |
| KR | 20150105059 A | 9/2015 |
| TW | 201602646 A | 1/2016 |

OTHER PUBLICATIONS

Non-Final Office Action issued in U.S. Appl. No. 17/065,712, dated Oct. 14, 2022.

\* cited by examiner

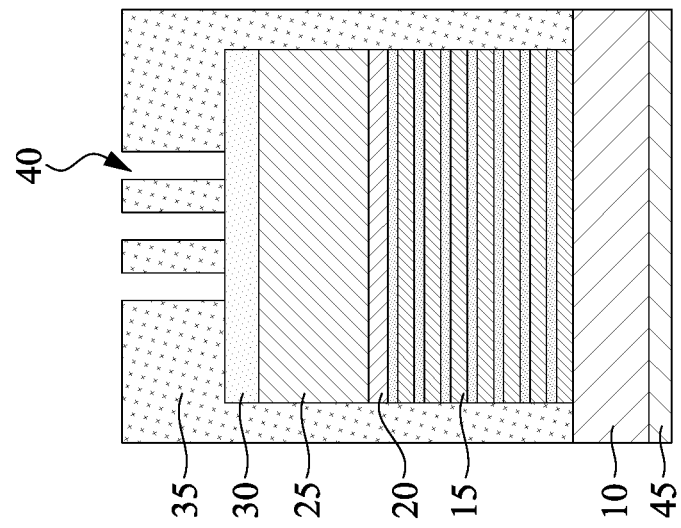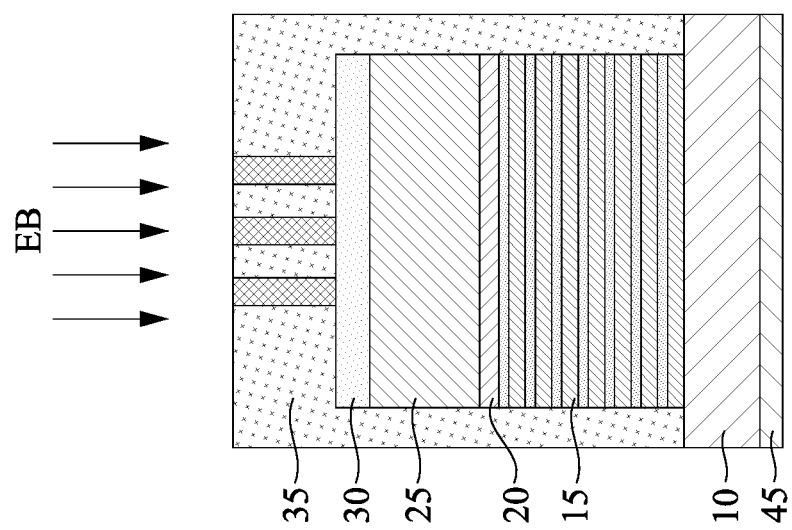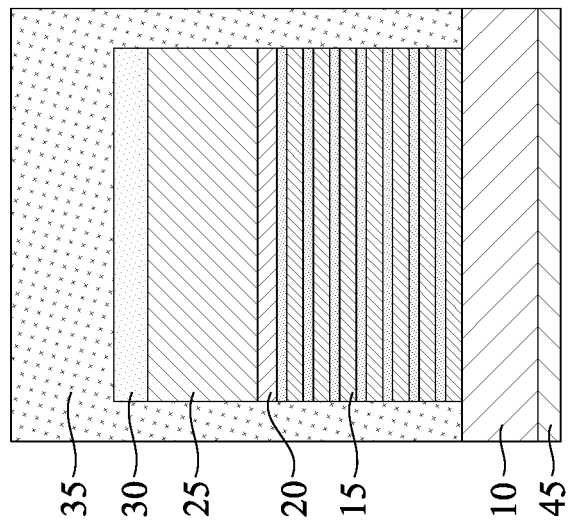

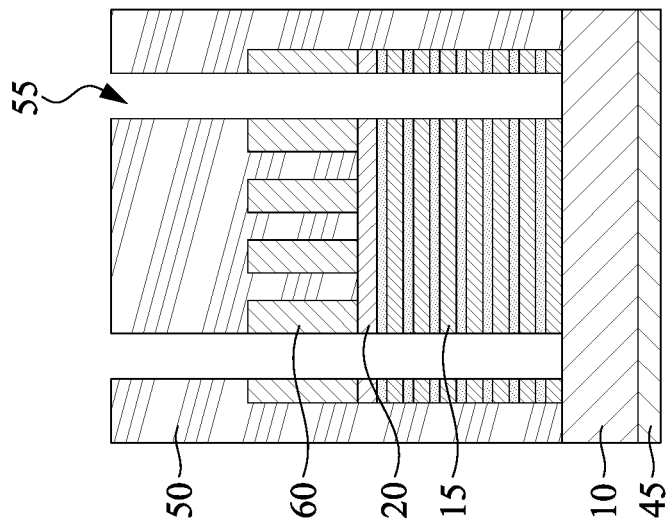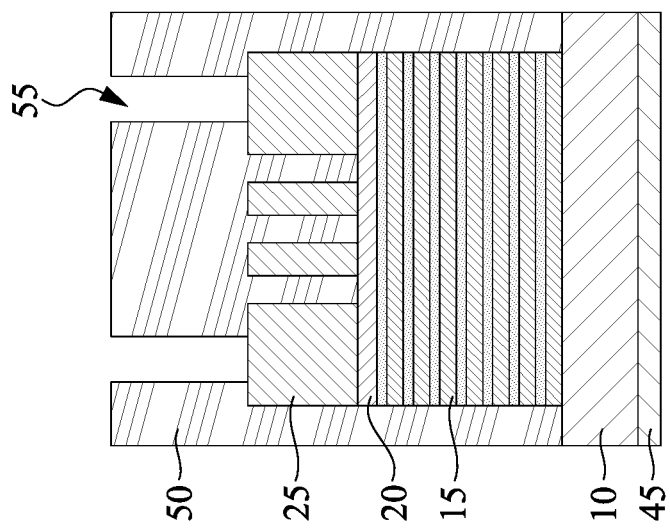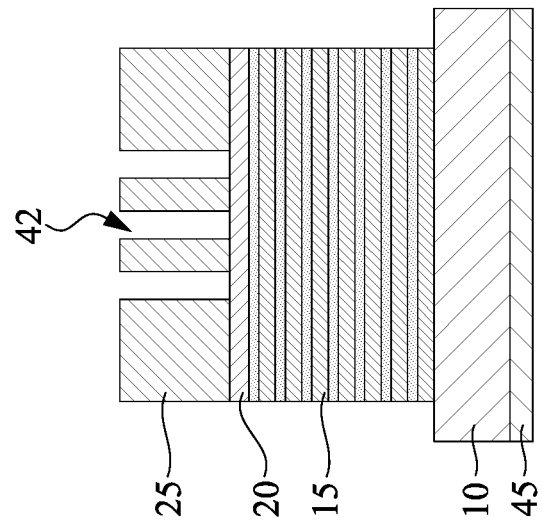

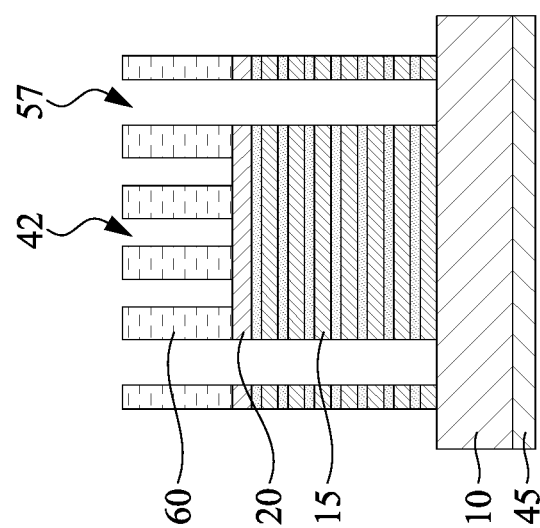

Photo resist layer (PR)
Target layer (TL)
Substrate

PR | PR
TL | TL
Substrate

TL | TL
Substrate

EUV PHOTO MASKS AND MANUFACTURING METHOD THEREOF

RELATED APPLICATIONS

This application is a continuation of U.S. patent application Ser. No. 17/065,712 filed Oct. 8, 2020, which claims priority to U.S. Provisional Patent Application No. 63/028,637 filed May 22, 2020, the entire contents of each of which are incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E and 2F schematically illustrate a method of fabricating an EUV photo mask according to an embodiment of the present disclosure.

FIGS. 3A, 3B, 3C, 3D, 3E and 3F schematically illustrate a method of fabricating an EUV photo mask according to an embodiment of the present disclosure.

FIG. 4 shows a cross sectional view of an EUV photo mask according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber has a low EUV reflectivity, for example, less than 3-5%.

The present disclosure provides an EUV reflective photo mask having a low reflective (high absorbing) absorber structure.

Figure 1A:
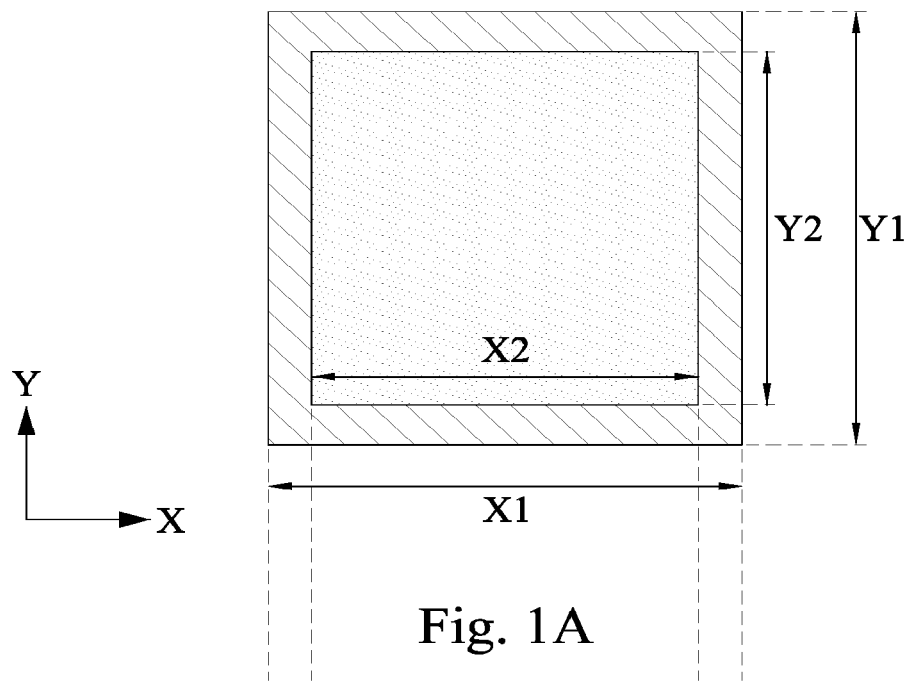
FIGS. 1A, 1B, 1C, 1D and 1E show EUV photo mask blanks according to embodiments of the present disclosure.
Figure 1B:
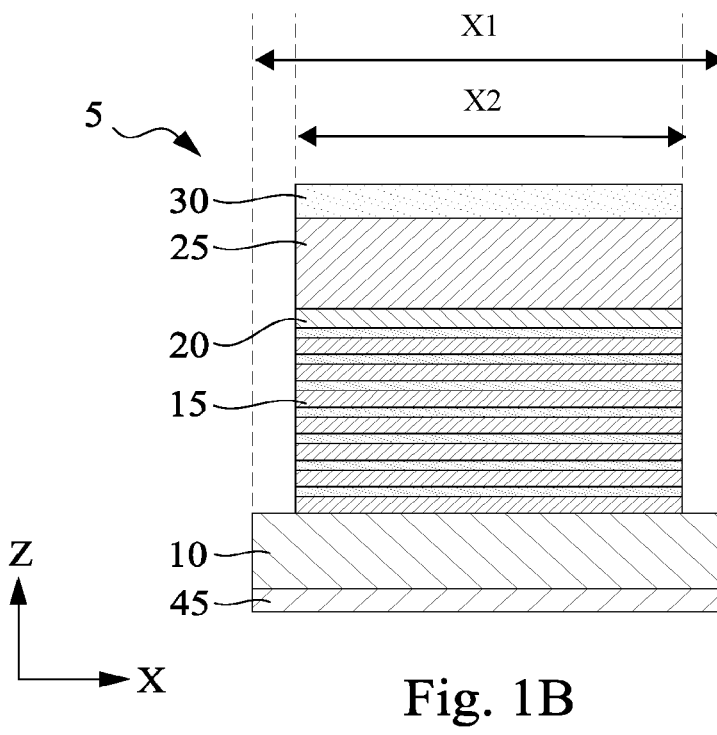

FIGS. 1A and 1B show an EUV reflective photo mask blank according to an embodiment of the present disclosure. FIG. 1A is a plan view (viewed from the top) and FIG. 1B is a cross sectional view along the X direction.

In some embodiments, the EUV photo mask with circuit patterns is formed from a EUV photo mask blank 5. The EUV photo mask blank 5 includes a substrate 10, a multilayer Mo/Si stack 15 of multiple alternating layers of silicon and molybdenum, a capping layer 20, an absorber layer 25 and a hard mask layer 30. Further, a backside conductive layer 45 is formed on the backside of the substrate 10, as shown in FIG. 1B.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness of about 20 mm. In other embodiments, the size of the substrate 10 is smaller than 152 mm×152 mm and equal to or greater than 148 mm×148 mm. The shape of the substrate 10 is square or rectangular.

In some embodiments, the functional layers above the substrate (the multilayer Mo/Si stack 15, the capping layer 20, the absorber layer 25 and the hard mask layer 30) have a smaller width than the substrate 10. In some embodiments, the size of the functional layers is in a range from about 138 mm×138 mm to 142 mm×142 mm. The shape of the functional layers is square or rectangular.

Figure 1C:
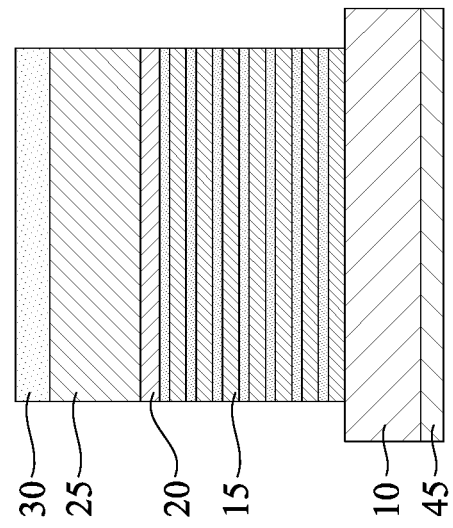

In other embodiments, the absorber layer 25 and the hard mask layer 30 have a smaller size in the range from about 138 mm×138 mm to 142 mm×142 mm than the substrate 10, the multilayer Mo/Si stack 15 and the capping layer 20 as shown in FIG. 1C. The smaller size of one or more of the functional layers can be formed by using a frame shaped cover having an opening in a range from about 138 mm×138 mm to 142 mm×142 mm, when forming the respective layers by, for example, sputtering. In other embodiments, all of the layers above the substrate 10 have the same size as the substrate 10.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about is about 3 nm.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer 15 to prevent oxidation of the multilayer stack 15 in some embodiments. In some embodiments, the capping layer 20 is made of ruthenium, a ruthenium alloy (e.g., RuNb, RuZr, RuZrN, RuRh, RuNbN, RuRhN, RuV or RuVN) or a ruthenium based oxide (e.g., $RuO_2$, RuNbO, RiVO or RuON), having a thickness of from about 2 nm to about 10 nm. In certain embodiments, the thickness of the capping layer 20 is from about 2 nm to about 5 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20.

The absorber layer 25 is disposed over the capping layer 20. In embodiments of the present disclosure, the absorber layer 25 includes a Cr based material, such as Cr, CrO and/or CrON with a nitrogen amount of about 16 atomic % to about 40 atomic % and an oxygen amount of more than 0 atomic to about 30 atomic %. In some embodiments, the absorber layer 25 has a multilayered structure of Cr, CrO or CrON. In some embodiments, the thickness of the absorber layer 25 is in a range from about 20 nm to about 50 nm, and is in a range from about 35 nm to about 46 nm in other embodiments. In some embodiments, when the Cr based material includes oxygen, the amount of the oxygen is in a range from about 5 atomic % to about 30 atomic %, and is in a range from about 10 atomic % to about 25 atomic % in other embodiments. In some embodiments, the absorber layer 25 further includes one or more elements of Co, Te, Hf and/or Ni.

In some embodiments, an antireflective layer (not shown) is optionally disposed over the absorber layer 25. The antireflective layer is made of a silicon oxide in some embodiments, and has a thickness of from about 2 nm to about 10 nm. In other embodiments, a TaBO layer having a thickness in a range from about 12 nm to about 18 nm is used as the antireflective layer. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

The hard mask layer 30 is disposed over the absorbing layer 25 in some embodiments. The hard mask layer 30 is formed over the antireflective layer in some embodiments. In some embodiments, the hard mask layer 30 is made of a Ta based material, such as TaB, TaO, TaBO or TaBN. In other embodiments, the hard mask layer 30 is made of silicon, a silicon-based compound (e.g., SiN or SiON), ruthenium or a ruthenium-based compound (Ru or RuB). The hard mask layer 30 has a thickness of about 4 nm to about 20 nm in some embodiments. In some embodiments, the hard mask layer 30 is formed by chemical vapor deposition, plasma-enhanced chemical vapor deposition, atomic layer deposition, physical vapor deposition, or any other suitable film forming method.

In some embodiments, the backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material. In some embodiments, the tantalum boride is crystal. The crystalline tantalum boride includes TaB, $Ta_5B_6$, $Ta_3B_4$ and $TaB_2$. In other embodiments, the tantalum boride is poly crystal or amorphous. In other embodiments, the backside conductive layer 45 is made of a Cr based conductive material (CrN or CrON). In some embodiments, sheet resistance of the backside conductive layer 45 is equal to or smaller than 20Ω/□. In certain embodiments, the sheet resistance of the backside conductive layer 45 is equal to or more than 0.1Ω/□. In some embodiments, surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm (within the EUV photo mask). In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

Figure 1D:
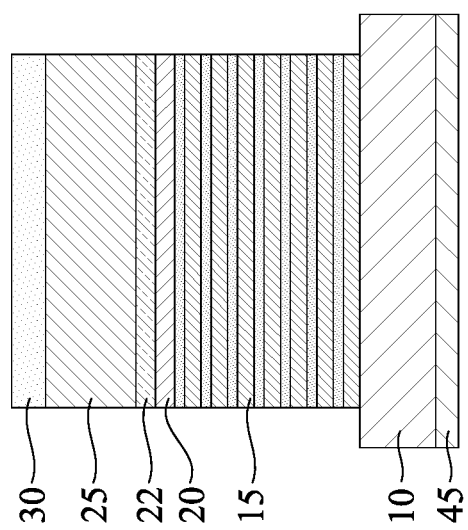

In some embodiments, as shown in FIG. 1D, an additional (intermediate) layer 22 is formed between the capping layer 20 and the absorber layer 25. The additional layer 22 is for protecting the capping layer in some embodiments. In some embodiments, the additional layer 22 includes Ta based material, such as TaB, TaO, TaBO or TaBN, silicon, a silicon-based compound (e.g., silicon oxide, SiN, SiON or MoSi), ruthenium, or a ruthenium-based compound (Ru or RuB). The additional layer 22 has a thickness of about 2 nm to about 20 nm in some embodiments. In some embodiments, the additional layer 22 is formed by chemical vapor deposition, plasma-enhanced chemical vapor deposition, atomic layer deposition, physical vapor deposition, or any other suitable film forming method. In some embodiments, the additional layer 22 functions as an etching stop layer during a patterning operation of the absorber layer.

In other embodiments, the additional layer 22 is a photo catalytic layer that can catalyze hydrocarbon residues formed on the photo mask into $CO_2$ and/or $H_2O$ with EUV radiation. Thus an in-situ self-cleaning of the mask surface is performed. In some embodiments, In the EUV scanner system, oxygen and hydrogen gases are injected into the EUV chamber to maintain the chamber pressure (e.g., at about 2 Pa). The chamber background gas can be a source of oxygen. In addition to the photo catalytic function, the photo catalytic layer is designed to have sufficient durability and resistance to various chemicals and various chemical processes, such as cleaning and etching. In some examples, ozonated water used to make the EUV reflective mask in the subsequent process damages the capping layer 20 made of Ru and results in a significant EUV reflectivity drop. It was further observed that after Ru oxidation, Ru oxide is easily etched away by an etchant, such as $Cl_2$ or $CF_4$ gas. In some embodiments, the photo catalytic layer includes one or more of titanium oxide ($TiO_2$), tin oxide (SnO), zinc oxide (ZnO) and cadmium sulfide (CdS). The thickness of the photo catalytic layer 22 is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

Figure 1E:
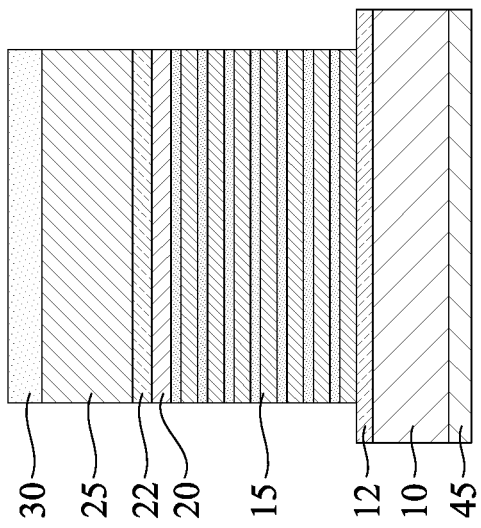

In some embodiments, as shown in FIG. 1E, a substrate protection layer 12 is formed between the substrate 10 and the multilayer stack 15. In some embodiments, the substrate protection layer 12 is made of Ru or a Ru compound, such as RuO, RuNb, RuNbO, RuZr and RuZrO. In some embodiments, the substrate protection layer 12 is made of the same material as or different material from the capping layer 20.

The thickness of the substrate protection layer 12 is in a range from about 2 nm to about 10 nm in some embodiments.

FIGS. 2A-2F and 3A-3F schematically illustrate a method of fabricating an EUV photo mask for use in extreme ultraviolet lithography (EUVL). It is understood that additional operations can be provided before, during, and after processes shown by FIGS. 2A-3F, and some of the operations described below can be replaced or eliminated for additional embodiments of the method. The order of the operations/processes may be interchangeable.

In the fabrication of an EUV photo mask, a first photoresist layer 35 is formed over the hard mask layer 30 of the EUV photo mask blank as shown in FIG. 2A, and the photoresist layer 35 is selectively exposed to actinic radiation EB as shown in FIG. 2B. Before the first photoresist layer 35 is formed, the EUV photo mask blank is subject to inspection in some embodiments. The selectively exposed first photoresist layer 35 is developed to form a pattern 40 in the first photoresist layer 35 as shown in FIG. 2C. In some embodiments, the actinic radiation EB is an electron beam or an ion beam. In some embodiments, the pattern 40 corresponds to a pattern of semiconductor device features for which the EUV photo mask will be used to form in subsequent operations.

Figure 2F:
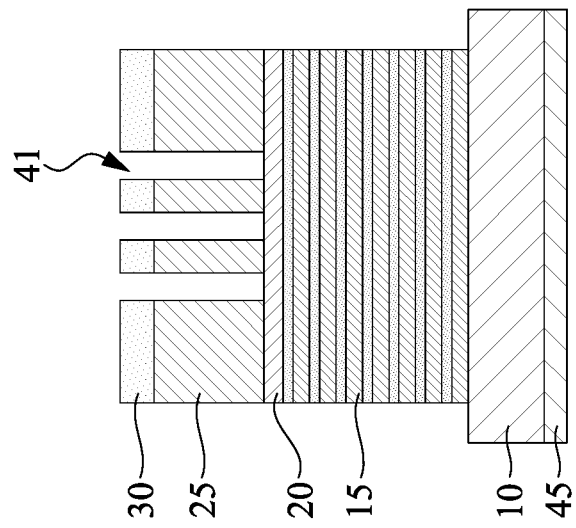
Figure 2E:
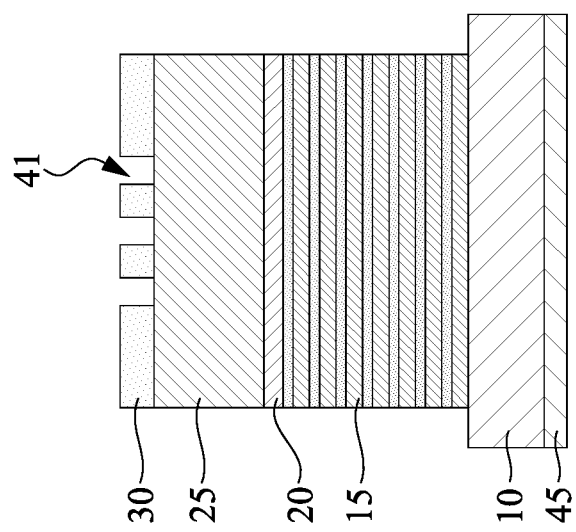
Figure 2D:
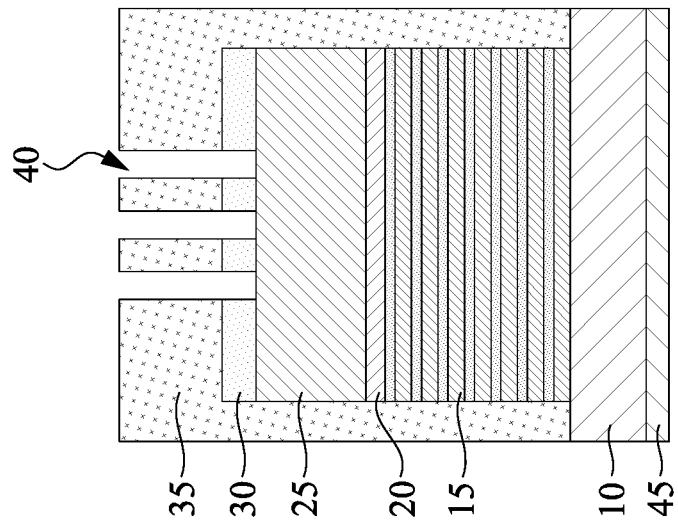

Next, the pattern 40 in the first photoresist layer 35 is extended into the hard mask layer 30 forming a pattern 41 in the hard mask layer 30 exposing portions of the absorber layer 25, as shown in FIG. 2D. The pattern 41 extended into the hard mask layer 30 is formed by etching, in some embodiments, using a suitable wet or dry etchant that is selective to the absorber layer 25. After the pattern 41 in the hard mask layer 30 is formed, the first photoresist layer 35 is removed by a photoresist stripper to expose the upper surface of the hard mask layer 30, as shown in FIG. 2E.

Then, the pattern 41 in the hard mask layer 30 is extended into the absorber layer 25 forming a pattern 42 in the absorber layer 25 exposing portions of the capping layer 20, as shown in FIG. 2F, and then the hard mask layer 30 is removed as shown in FIG. 3A. The pattern 42 extended into the absorber layer 25 is formed by etching, in some embodiments, using a suitable wet or dry etchant that is selective to the absorber layer 25. In some embodiments, plasma dry etching is used.

As shown in FIG. 3B, a second photoresist layer 50 is formed over the absorber layer 25 filling the pattern 42 in the absorber layer 25. The second photoresist layer 50 is selectively exposed to actinic radiation such as electron beam, ion beam or UV radiation. The selectively exposed second photoresist layer 50 is developed to form a pattern 55 in the second photoresist layer 50 as shown in FIG. 3B. The pattern 55 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Figure 3D:
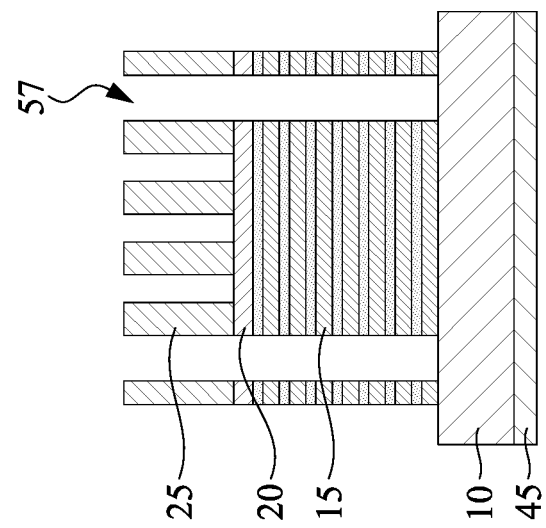

Next, the pattern 55 in the second photoresist layer 50 is extended into the absorber layer 25, capping layer 20, and Mo/Si multilayer 15 forming a pattern 57 (see, FIG. 3D) in the absorber layer 25, capping layer 20, and Mo/Si multilayer 15 exposing portions of the substrate 10, as shown in FIG. 3C. The pattern 57 is formed by etching, in some embodiments, using one or more suitable wet or dry etchants that are selective to each of the layers that are etched. In some embodiments, plasma dry etching is used.

Then, the second photoresist layer 50 is removed by a suitable photoresist stripper to expose the upper surface of the absorber layer 25 as shown in FIG. 3D. The black boarder pattern 57 in the absorber layer 25, capping layer 20, and the Mo/Si multilayer 15 defines a black border of the photo mask in some embodiments of the disclosure.

Figure 3E:
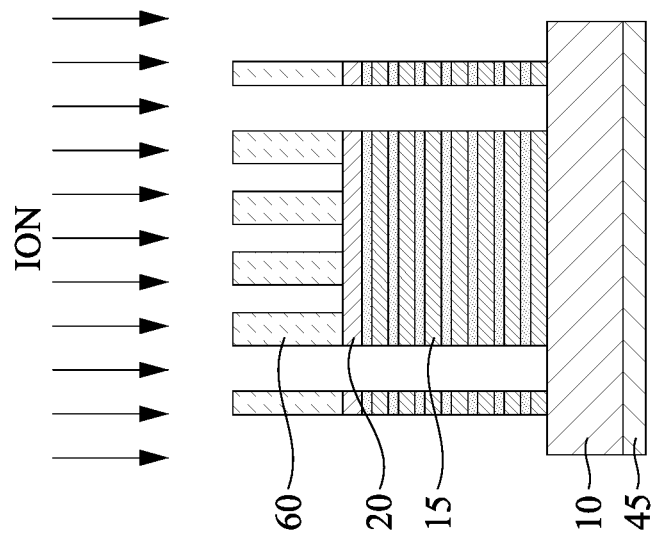

Next, as shown in FIG. 3E, one or more ion implantation operations is performed to change the composition of the patterned absorber layer 25 into a converted absorber layer 60. In some embodiments, ions ION, such as nitrogen ions, are implanted to the patterned absorber layer 25. In some embodiments, an acceleration voltage of the nitrogen ion implantation is in a range from about 0.1 keV to about 5 keV and is in a range from about 0.5 keV to 2 keV in other embodiments. When the acceleration voltage is too high, the ions may pass through the absorber layer and be implanted into the capping layer or the multilayer stack mainly, and when the acceleration voltage is too low, only an upper portion of the absorber layer is implanted with ions. In some embodiments, a dose amount is in a range from about $5 \times 10^{15}$ ion/cm$^2$ to $1 \times 10^{17}$ ions/cm$^2$, and is in a range from about $1 \times 10^{16}$ ion/cm$^2$ to $4 \times 10^{16}$ ions/cm$^2$ in other embodiments. When the dose amount is too low, nitrogen concentration in the converted absorber layer 60 is insufficient to obtain a higher EUV absorption coefficient (see, below), and if the dose amount of too high, mechanical strength of the converted absorber layer may decrease. In some embodiments, the ion implantation is performed under a pressure in a range from about $1 \times 10^{-9}$ Pa to $6 \times 10^{-8}$ Pa at a room temperature (25° C.).

When the absorber layer 25 is made of Cr (the Cr amount is more than 90 atomic %), the absorber layer 25 is converted to CrN with a nitrogen amount in a range from about 5 atomic % to about 16 atomic % in some embodiments. When the absorber layer 25 is made of CrO, the absorber layer 25 is converted to CrON with a nitrogen amount in a range from about 5 atomic % to about 16 atomic % and an oxygen amount in a range from more than 0 atomic % to about 5 atomic % in some embodiments. In some embodiments, the CrON layer is a nitrogen rich (more than oxygen) CrON layer. When the absorber layer 25 is made of CrON, the absorber layer 25 is converted to nitrogen rich CrON (more than oxygen) with a nitrogen amount in a range from about 5 atomic % to about 20 atomic % and an oxygen amount in a range from more than 0 atomic % to about 4 atomic % in some embodiments.

Figure 3F:
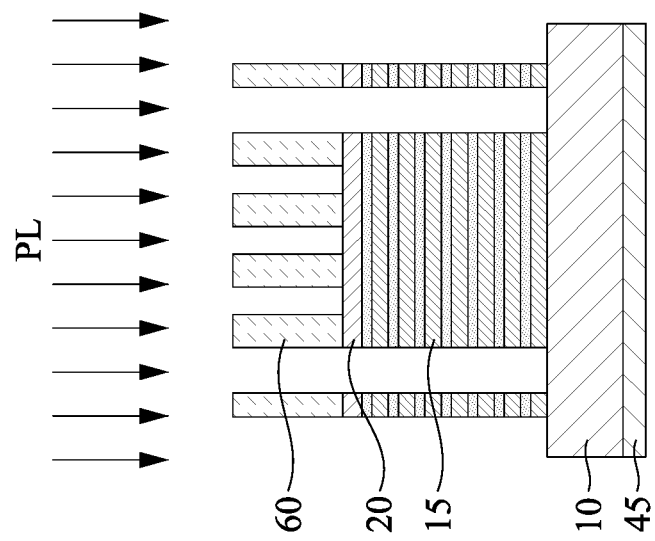

In other embodiments, nitrogen in introduced into the patterned absorber layer 25 by using plasma PL, to form a converted absorber layer 60, as shown in FIG. 3F. In some embodiments, the plasma PL is nitrogen plasma generated from N$_2$ gas and/or NH$_3$ gas. In some embodiments, the plasma is RF plasma, ICP (induction coupling plasma), or a microwave generated plasma (e.g., ECR plasma). In some embodiments, source power is in a range from about 200 W to about 600 W and is in a range from about 300 W to 500 W in other embodiments. In some embodiments, bias power is in a range from about 1 W to about 50 W and is in a range from about 5 W to 10 W in other embodiments. In some embodiments, a flow rate of the N$_2$ gas is in a range from about 100 sccm to 1000 sccm and is in a range from about 200 sccm to about 500 sccm in other embodiments. A partial pressure of the N$_2$ is in a range from about 1 mTorr to 50 mTorr in some embodiments, and is in a range from about 2 mTorr to about 10 mTorr in other embodiments. In some embodiments, both the ion implantation and the plasma treatment convert the patterned absorber layer 25 into the converted absorber layer 60.

Generally, a Cr based material (CrN, CrON or CrO) has a high EUV absorption (extinction) coefficient k. For example, CrN has a k-value of 0.0387, which is higher than the k value (0.031) of TaBN and the k value (0.027) of TaBO. Accordingly, it is possible to reduce the thickness of the absorber layer (e.g., from 70 nm of TaBN to 46 nm of CrN), which can suppress three-dimensional effects of the patterned absorber layer. However, a CrN layer or a nitrogen rich CrON layer is difficult to etch because of its low etching rate. Thus, directly patterning the CrN layer may cause a poor pattern profile which affects resolution of EUV lithography. In the present embodiments, a Cr, CrO or CrON (low nitrogen concentration) layer is subjected to the etching operation (see, FIG. 2F) and then converted to a CrN or nitrogen rich CrON layer. Thus, it is possible to obtain a good pattern profile with a higher etching rate and a higher EUV absorption coefficient.

In other embodiments, instead of or in addition to introduction of nitrogen as set forth above, one or more elements of Li, Be, B, C or Si are introduced into the patterned absorber layer 25 by, for example, an ion implantation process or a plasma process. The conditions of the ion implantation and/or the plasma process for Li, Be, B, C and/or Si are the same as or similar to those for nitrogen. Accordingly, the converted absorber layer 60 includes a Cr, CrO, CrN or CrON layer containing one or more of Li, Be, B, C or Si. The amount of Li, Be, B, C and/or Si is in a range from about 5 atomic % to 24 atomic % in some embodiments. In some embodiments, these elements are not contained in the absorber layer 25 of the mask blank 5. In some embodiments, the absorber layer 60 is one or more of CrLi, CrBe, CrB, CrC or CrSi having the k value more than 0.03.

In other embodiments, the conversion process (the ion implantation and/or the plasma treatment as set forth above) is performed after the patterning of the absorber layer and the removal of the hard mask layer and before forming the black boarder pattern 57.

After the conversion process of the patterned absorber layer, an annealing operation is performed in some embodiments. In some embodiments, the annealing temperature is in a range from about 60° C. to about 120° C. Further, the photo mask undergoes a cleaning operation, inspection, and the photo mask is repaired as necessary, to provide a finished photo mask.

FIG. 4 shows a cross sectional view of a finished EUV photo mask according to embodiments of the present disclosure. In some embodiments, the EUV photo mask with circuit patterns 42 as shown in FIG. 4 includes a substrate 10, a multilayer Mo/Si stack 15 of multiple alternating layers of silicon and molybdenum, a capping layer 20, and a patterned absorber layer 60. Further, a black border pattern 57 is formed in the absorber layer 60, the capping layer 20 and the multilayer stack 15, and a backside conductive layer 45 is formed on the backside of the substrate 10. In some embodiments, the patterned absorber layer 60 includes a CrN layer, a nitrogen rich CrON layer, and/or a Cr, CrN, CrO or CrON layer doped with one or more of Li, Be, B, C or Si. In some embodiments, when one or more of Li, Be, B, C or Si is included, the absorber layer is substantially free from nitrogen and/or oxygen (less than about 1 atomic %).

In some embodiments, the absorber layer is a single layer of the aforementioned Cr based material, or includes multilayers one or more of which are the aforementioned Cr based material. In some embodiments, the thickness of the absorber layer 60 is in a range from about 20 nm to about 50 nm, and is in a range from about 35 nm to about 46 nm in other embodiments. In some embodiments, at the bottom of the openings of the absorber layer 60, the capping layer 20 contains one or more of N, Li, Be, B, C or Si more than the other portions of the photo mask (e.g., under the absorber layer 60 or a bottom of the capping layer near the multilayer stack 15).

Figure 5A:
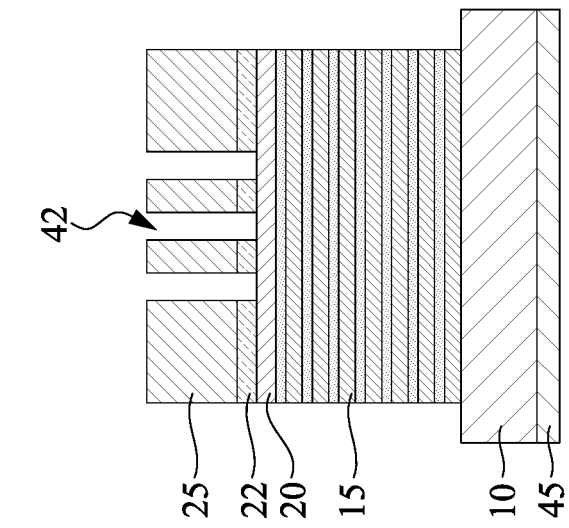
FIGS. 5A, 5B and 5C show cross sectional views of a multilayer structure of an absorber layer according to another embodiment of the present disclosure.
Figure 5B:
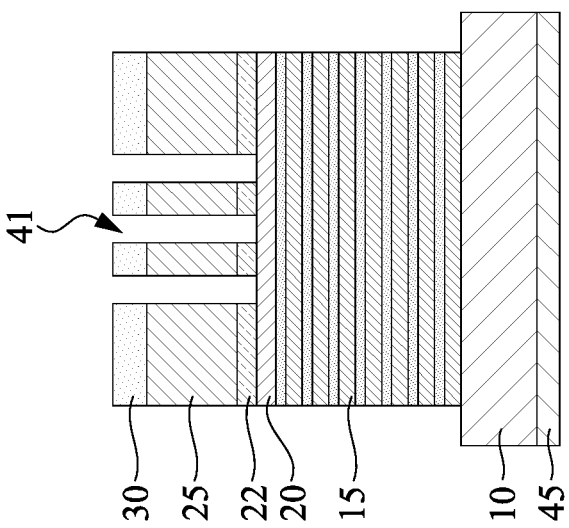
Figure 5C:
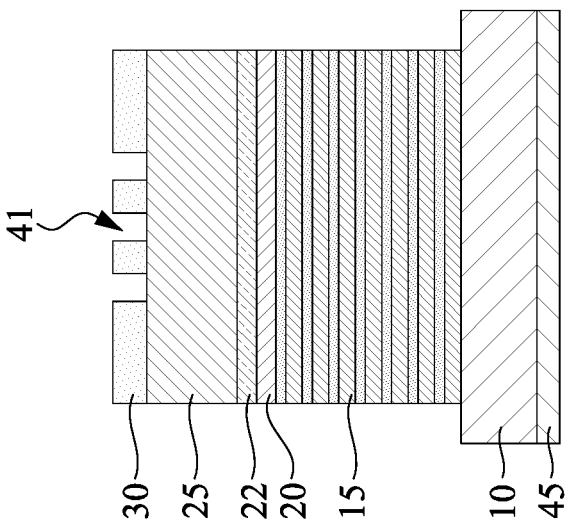

FIGS. 5A, 5B and 5C show cross sectional views of a multilayer structure of an absorber layer according to another embodiment of the present disclosure. It is understood that additional operations can be provided before, during, and after processes shown by FIGS. 2A-3F, and some of the operations described below can be replaced or eliminated, for additional embodiments of the method. The order of the operations/processes may be interchangeable. Materials, configurations, processes and/or dimensions as explained with respect to the foregoing embodiments may be employed in the following embodiments and detailed description thereof may be omitted. The embodiment of FIGS. 5A, 5B and 5C is for a mask blank as shown in FIG. 1D. FIG. 5A shows a structure after the hard mask layer 30 is patterned similar to FIG. 2E. Then, the absorber layer is patterned (etched) by using the patterned hard mask layer 25 as shown in FIG. 5B. In some embodiments, when the additional layer 22 is made of the same material as or similar material to the hard mask layer 30, the etching substantially stops at the additional layer 22. Then, as shown in FIG. 5C, the hard mask layer 30 is removed together with a part of the additional layer 22 at the bottom of the opening patterns of the absorber layer 25. In some embodiments, the etching is wet etching and/or dry etching.

In other embodiments, when the additional layer 22 is made of a different material than the hard mask layer 30, the etching substantially stops at the additional layer 22 or also etches the additional layer 22. In some embodiments, when the etching substantially stops at the additional layer 22, the additional layer 22 is subsequently patterned or remains unetched.

Figure 6:
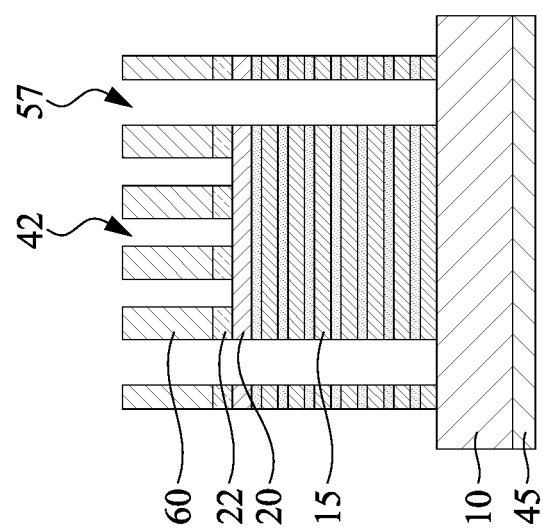
FIG. 6 shows a cross sectional view of an EUV photo mask according to embodiments of the present disclosure.

FIG. 6 shows a cross sectional view of a finished EUV photo mask according to embodiments of the present disclosure. In some embodiments, the EUV photo mask with circuit patterns 42 as shown in FIG. 6 includes a substrate 10, a multilayer Mo/Si stack 15 of multiple alternating layers of silicon and molybdenum, a capping layer 20, a patterned additional layer 22, and a patterned absorber layer 60. Further, a black border pattern 57 is formed in the absorber layer 60, the capping layer 20 and the multilayer stack 15, and a backside conductive layer 45 is formed on the backside of the substrate 10. In some embodiments, the patterned absorber layer 60 includes a CrN layer, a nitrogen rich CrON layer, and/or a Cr, CrN, CrO or CrON layer doped with one or more of Li, Be, B, C or Si. In some embodiments, when one or more of Li, Be, B, C or Si is included, the absorber layer is substantially free from nitrogen and/or oxygen (less than about 1 atomic %). In some embodiments, the absorber layer is a single layer of the aforementioned Cr based material, or includes multilayers one or more of which are the aforementioned Cr based material. In some embodiments, the thickness of the absorber layer 60 is in a range from about 20 nm to about 50 nm, and is in a range from about 35 nm to about 46 nm in other embodiments. In some embodiments, at the bottom of the openings of the absorber layer 60, the capping layer 20 contains one or more of N, Li, Be, B, C or Si more than the other portions of the photo mask (e.g., under the absorber layer 60 or a bottom of the capping layer near the multilayer stack 15). If the additional layer 22 remains at the bottom of the openings of the absorber layer 60, the additional layer 22 contains one or more of N, Li, Be, B, C or Si at the bottom of the openings more than the other portions of the photo mask (e.g., under the absorber layer 60 or a bottom of the additional layer 22 near the capping layer 20).

Figure 7:
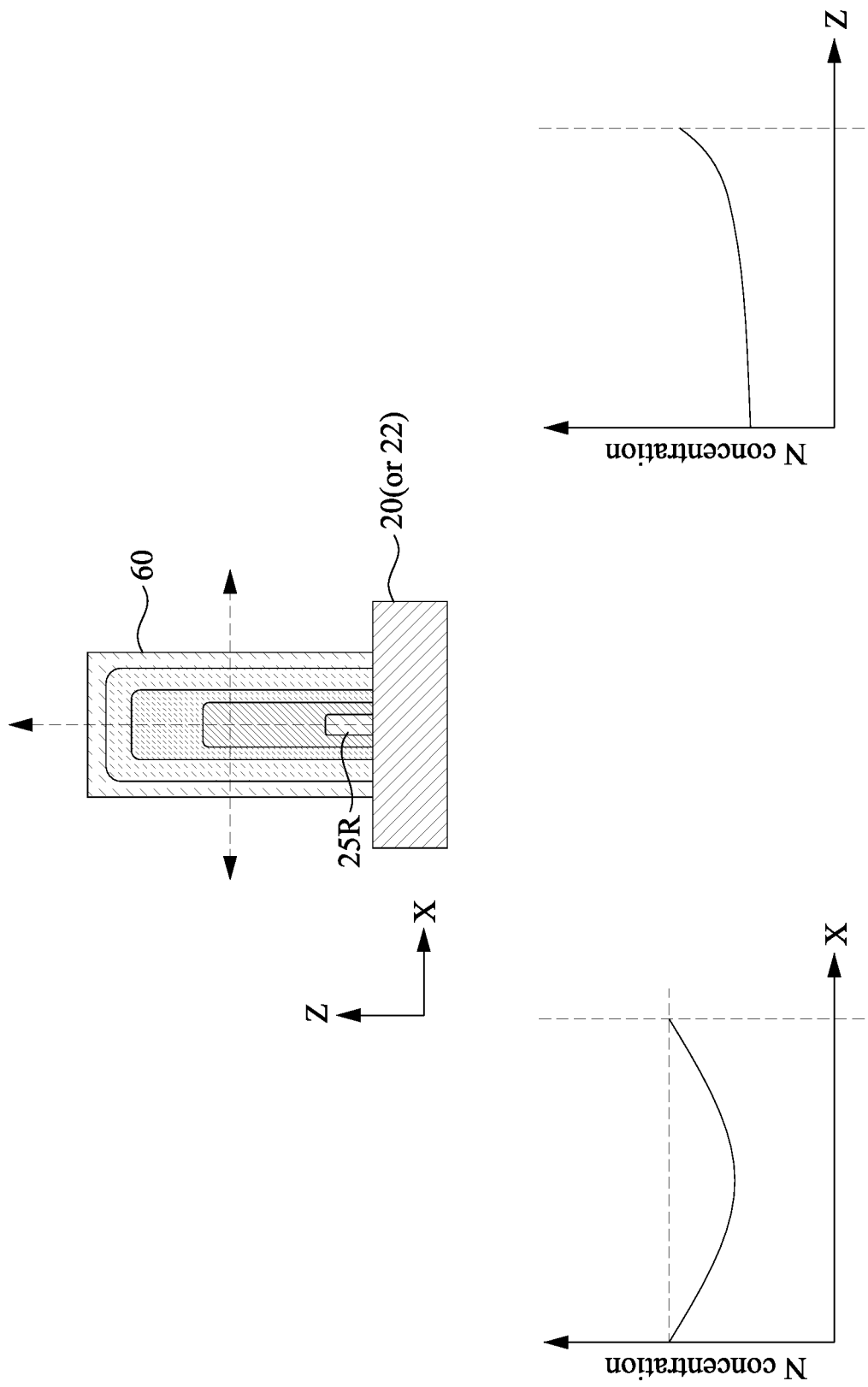
FIG. 7 shows nitrogen concentration profiled of an absorber layer of an EUV photo mask according to embodiments of the present disclosure.

FIG. 7 shows nitrogen concentration profile of an absorber layer of an EUV photo mask according to embodiments of the present disclosure. As set forth above, nitrogen (or other elements Li, Be, B, C and/or Si) is introduced after the absorber layer 25 is patterned from outside the pattern. Accordingly, in some embodiments, the nitrogen (or Li, Be, B, C and/or Si) does not have a uniform concentration profile (distribution) within the absorber pattern 60.

In some embodiments, along the horizontal direction (passing the center (center of gravity) of the absorber pattern 60) the nitrogen (or Li, Be, B, C, and/or Si concentration decreases from one side surface, has a minimum and then increases to the opposite side surface. The ratio of the highest concentration to the minimum concentration is in a range from about 1.1 to about 5.0 in some embodiments.

In some embodiments, along the vertical direction (passing the center of the absorber pattern 60) the nitrogen (or Li, Be, B, C, and/or Si concentration increases from the bottom of the absorber pattern 60 to the top of the absorber pattern 60. The ratio of the highest concentration to the minimum concentration is in a range from about 1.1 to about 10.0. In some embodiments, the ratio of the highest concentration to the minimum concentration in the entire absorber pattern 60 is in a range from about 1.1 to about 10.0.

In some embodiments, near the interface between the absorber layer 60 and the capping layer 20, non-converted absorber region 25R (e.g., 1 $nm^3$-100 $nm^3$), which is substantially free from the later introduced elements, remains. In some embodiments, the region has a volume at least 1 $nm^3$, 2 $nm^3$, 5 $nm^3$, or 10 $nm^3$.

Figure 8A:
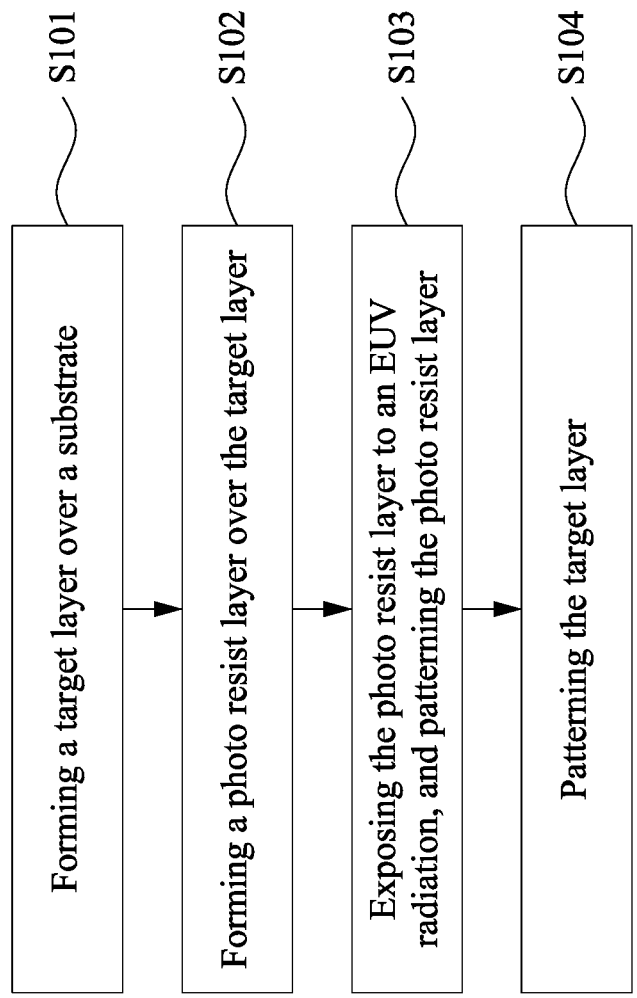
FIG. 8A shows a flowchart of a method making a semiconductor device.
Figures 8B, 8C, 8D, 8E:
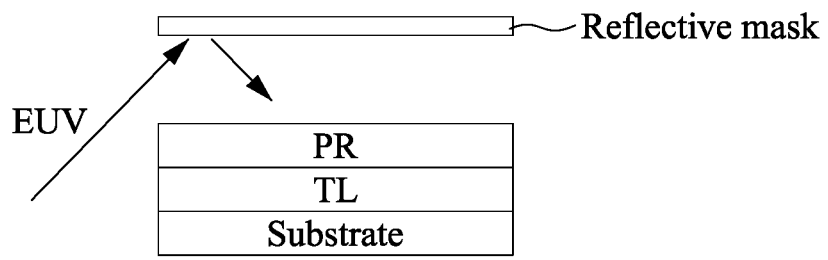
FIGS. 8B, 8C, 8D and 8E show a sequential manufacturing operation of a method of making a semiconductor device in accordance with embodiments of present disclosure.

FIG. 8A shows a flowchart of a method of making a semiconductor device, and FIGS. 8B, 8C, 8D and 8E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S101 of FIG. 8A, a target layer to be patterned is formed over the semiconductor substrate. In certain embodiments, the target layer is the semiconductor substrate. In some embodiments, the target layer includes a conductive layer, such as a metallic layer or a polysilicon layer, a dielectric layer, such as silicon oxide, silicon nitride, SiON, SiOC, SiOCN, SiCN, hafnium oxide, or aluminum oxide, or a semiconductor layer, such as an epitaxially formed semiconductor layer. In some embodiments, the target layer is formed over an underlying structure, such as isolation structures, transistors or wirings. At S102, of FIG. 8A, a photo resist layer is formed over the target layer, as shown in FIG. 8B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S103 of FIG. 8A, the photoresist layer is patterned using an EUV reflective mask as set forth above, as shown in FIG. 8B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S104 of FIG. 8A, the target layer is patterned utilizing the patterned photoresist layer as an etching mask, as shown in FIG. 8D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8E.

In the present disclosure, a Cr, CrO or CrON (low nitrogen concentration) layer is subjected to the etching operation and then converted to a CrN or nitrogen rich CrON layer, and thus it is possible to obtain a good pattern profile with a higher etching rate and a higher EUV absorption coefficient. Further, since a CrN or nitrogen rich CrON layer have a higher EUV absorption coefficient, it is possible to reduce the thickness of the absorber layer, which in turn suppresses the three-dimensional effect in the EUV lithography.

It will be understood that not all advantages have been necessarily discussed herein, no particular advantage is required for all embodiments or examples, and other embodiments or examples may offer different advantages.

According to one aspect of the present application, a reflective mask includes a substrate, a reflective multilayer disposed on the substrate, a capping layer disposed on the reflective multilayer, and an absorber layer disposed on the capping layer. The absorber layer includes a CrN, or CrON layer, having a non-uniform nitrogen concentration. In one or more of the foregoing and following embodiments, a thickness of the absorber layer is in a range from 20 nm to 50 nm. In one or more of the foregoing and following embodiments, the absorber layer includes one or more of Li, Be, B, C or Si. In one or more of the foregoing and following embodiments, the absorber layer includes one or more of Li, Be or C. In one or more of the foregoing and following embodiments, the absorber layer includes the CrON layer, in which a nitrogen amount is greater than an oxygen amount. In one or more of the foregoing and following embodiments, a size of an outer periphery of the absorber layer is smaller than a size of an outer periphery of the substrate in plan view. In one or more of the foregoing and following embodiments, the size of the outer periphery of the absorber layer is in a range from 138 mm×138 mm to 142 mm×142 mm in plan view, and the size of the outer periphery of the substrate is in a range from 148 mm×148 mm to 152 mm×152 mm in plan view. In one or more of the foregoing and following embodiments, the absorber layer includes a region made of CrO or Cr.

In accordance with another aspect of the present disclosure, a reflective mask includes a substrate, a reflective multilayer disposed on the substrate, a capping layer disposed on the reflective multilayer, an intermediate layer disposed on the capping layer, and an absorber layer disposed on the intermediate layer. The absorber layer includes a CrN, or CrON layer, having a higher nitrogen concentration in a surface region of the absorber layer than in inside the absorber layer. In one or more of the foregoing and following embodiments, a thickness of the absorber layer is equal to or less than 45 nm. In one or more of the foregoing and following embodiments, the intermediate layer includes at least one of TaB, TaO, TaBO or TaBN, silicon, a silicon-based compound, ruthenium, or a ruthenium-based compound. In one or more of the foregoing and following embodiments, the intermediate layer includes at least one of titanium oxide ($TiO_2$), tin oxide (SnO), zinc oxide (ZnO) or cadmium sulfide (CdS). In one or more of the foregoing and following embodiments, the absorber layer includes the CrON layer, in which a nitrogen amount is greater than an oxygen amount. In one or more of the foregoing and following embodiments, a size of an outer periphery of the absorber layer is in a range from 138 mm×138 mm to 142 mm×142 mm in plan view, and a size of an outer periphery of the reflective multilayer is in a range from 148 mm×148 mm to 152 mm×152 mm in plan view. In one or more of the foregoing and following embodiments, the absorber layer includes a region made of CrO or Cr, the region having a volume of 1 $nm^3$-10 $nm^3$. In one or more of the foregoing and following embodiments, the region has a volume of at least 1 $nm^3$.

In accordance with another aspect of the present disclosure, an EUV reflective mask includes a substrate, a reflective multilayer disposed on the substrate a capping layer disposed on the reflective multilayer, and an absorber layer disposed on the capping layer. The absorber layer includes a Cr and at one or more of Li, Be, B, C or Si. In one or more of the foregoing and following embodiments, the one or more of Li, Be, B, C or Si have non-uniform distribution in the absorber layer. In one or more of the foregoing and following embodiments, the absorber layer further includes nitrogen. In one or more of the foregoing and following embodiments, the nitrogen has non-uniform distribution in the absorber layer.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer, and the absorber layer is made of Cr, CrO or CrON. The photo resist layer is patterned, the hard mask layer is patterned by using the patterned photo resist layer, the absorber layer is patterned by using the patterned hard mask layer, and ions are introduced into the patterned absorber layer by an ion implantation operation to form a converted absorber layer. In one or more of the foregoing and following embodiments, the ions are nitrogen ions. In one or more of the foregoing and following embodiments, the hard mask layer is removed after patterning the absorber layer, and the ions are introduced after the hard mask layer is removed. In one or more of the foregoing and following embodiments, the ions are also introduced into a part of the capping layer. In one or more of the foregoing and following embodiments, an annealing operation is performed after the ions are introduced. In one or more of the foregoing and following embodiments, the absorber layer of the mask blank includes Cr in an amount of 95 atomic % or more. In one or more of the foregoing and following embodiments, an acceleration voltage of the ion implantation operation is in a range from 0.1 keV to 5 keV. In one or more of the foregoing and following embodiments, a dose amount of the ion implantation operation is in a range from $5 \times 10^{15}$ ion/cm$^2$ to $1 \times 10^{17}$ ions/cm$^2$. In one or more of the foregoing and following embodiments, the mask blank further includes an intermediate layer between the capping layer and the absorber layer. In one or more of the foregoing and following embodiments, the intermediate layer is made of a same material as the hard mask layer. In one or more of the foregoing and following embodiments, in the patterning the absorber layer, the intermediate layer functions as an etch stop layer. In one or more of the foregoing and following embodiments, the ions are ions of one or more elements selected from the group consisting of Li, Be, B, C and Si. In one or more of the foregoing and following embodiments, the absorber layer of the mask blank includes Cr in an amount of 95 atomic % or more.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer, and the absorber layer includes Cr. The photo resist layer is patterned, the hard mask layer is patterned by using the patterned photo resist layer, the absorber layer is patterned by using the patterned hard mask layer, and nitrogen is introduced into the patterned absorber layer by a plasma process to form a converted absorber layer. In one or more of the foregoing and following embodiments, the absorber layer of the mask blank includes Cr in an amount of 95 atomic % or more. In one or more of the foregoing and following embodiments, the absorber layer of the mask blank is made of CrO or CrON.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer, and the absorber layer is made of Cr, CrO or CrON. The photo resist layer is patterned, the hard mask layer is patterned by using the patterned photo resist layer, the absorber layer is patterned by using the patterned hard mask layer, and an additional element is introduced into the patterned absorber layer to form a converted absorber layer. In one or more of the foregoing and following embodiments, the additional element is nitrogen. In one or more of the foregoing and following embodiments, the nitrogen is introduced by an ion implantation operation. In one or more of the foregoing and following embodiments, the nitrogen is introduced by a plasma process.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a reflective mask, the method comprising:
   forming a photo resist layer over a mask blank, the mask blank including a substrate, a reflective multilayer on the substrate, a capping layer on the reflective multilayer, an absorber layer on the capping layer and a hard mask layer, the absorber layer including Cr,
   wherein the mask blank comprises an intermediate layer between the capping layer and the absorber layer;
   patterning the photo resist layer;
   patterning the hard mask layer by using the patterned photo resist layer;
   patterning the absorber layer by using the patterned hard mask layer; and
   introducing nitrogen into the patterned absorber layer by a plasma process to form a converted absorber layer.

2. The method of claim 1, wherein the absorber layer of the mask blank includes Cr in an amount of 95 atomic % or more.

3. The method of claim 1, wherein the absorber layer of the mask blank is made of CrO or CrON.

4. The method of claim 1, wherein the plasma process comprises generating a nitrogen plasma from at least one of N$_2$ or NH$_3$ gas.

5. The method of claim 1, wherein the intermediate layer includes at least one of TaB, TaO, TaBO or TaBN, silicon, a silicon-based compound, ruthenium, or a ruthenium-based compound.

6. The method of claim 1, wherein the intermediate layer includes at least one of titanium oxide, tin oxide, zinc oxide, or cadmium sulfide.

7. A method of manufacturing a reflective mask, the method comprising:
   forming a photo resist layer over a mask blank, the mask blank including a substrate, a reflective multilayer on the substrate, a capping layer on the reflective multilayer, an absorber layer on the capping layer and a hard mask layer, the absorber layer being made of Cr, CrO or CrON;
   patterning the photo resist layer;
   patterning the hard mask layer by using the patterned photo resist layer;
   patterning the absorber layer by using the patterned hard mask layer; and
   introducing an additional element into the patterned absorber layer to form a converted absorber layer,
   wherein the additional element is one or more elements of Li, Be, B, C, or Si.

8. The method of claim 7, further comprising introducing nitrogen into the patterned hard mask layer.

9. The method of claim 8, wherein the nitrogen is introduced by an ion implantation operation.

10. The method of claim 9, wherein the nitrogen is introduced by a plasma process.

11. The method of claim 7, wherein an amount of the additional element is in a range from 5 atomic % to 24 atomic %.

12. The method of claim 7, wherein the mask blank further comprises an intermediate layer between the capping layer and the absorber layer.

13. The method of claim 12, wherein the intermediate layer includes at least one of TaB, TaO, TaBO or TaBN, silicon, a silicon-based compound, ruthenium, or a ruthenium-based compound.

14. The method of claim 12, wherein the intermediate layer includes at least one of titanium oxide, tin oxide, zinc oxide, or cadmium sulfide.

15. A method of manufacturing a photo mask, comprising:
forming a first photo resist layer over a mask blank, the mask blank including a substrate, a reflective multilayer disposed over the substrate, a capping layer disposed over the reflective multilayer, an intermediate layer disposed over the capping layer, an absorber layer disposed over the capping layer, and a hard mask layer disposed over the absorber layer;
patterning the photo resist layer;
patterning the hard mask layer;
patterning the absorber layer;
patterning the intermediate layer;
forming a second photo resist layer over the patterned absorber layer;
patterning the second photo resist layer to form a pattern in the second photo resist layer corresponding to a black border region of the photo mask;
extending the pattern in the second photo resist layer into the mask blank to expose a portion of the substrate; and
introducing an additional element into the patterned absorber layer to form a converted absorber layer.

16. The method according to claim 15, wherein the absorber layer comprises Cr, CrO, or CrON.

17. The method according to claim 15, wherein the additional element is introduced by an ion implantation operation or a plasma process.

18. The method according to claim 15, wherein the additional element is one or more elements of N, Li, Be, B, C, or Si.

19. The method of claim 15, wherein the intermediate layer includes at least one of TaB, TaO, TaBO or TaBN, silicon, a silicon-based compound, ruthenium, or a ruthenium-based compound.

20. The method of claim 15, wherein the intermediate layer includes at least one of titanium oxide, tin oxide, zinc oxide, or cadmium sulfide.

* * * * *